(12) United States Patent
Bandhauer et al.

(10) Patent No.: US 9,768,584 B2
(45) Date of Patent: Sep. 19, 2017

(54) HIGH FLUX DIODE PACKAGING USING PASSIVE MICROSCALE LIQUID-VAPOR PHASE CHANGE

(71) Applicant: Lawrence Livermore National Security, LLC, Livermore, CA (US)

(72) Inventors: Todd Bandhauer, Livermore, CA (US); Robert J. Deri, Pleasanton, CA (US); John W. Elmer, Danville, CA (US); Jack Kotovsky, Alameda, CA (US); Susant Patra, Brentwood, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 15/080,507

(22) Filed: Mar. 24, 2016

(65) Prior Publication Data

US 2016/0315445 A1    Oct. 27, 2016

Related U.S. Application Data

(60) Provisional application No. 62/137,368, filed on Mar. 24, 2015.

(51) Int. Cl.
| | | |
|---|---|---|
| *H01S 3/04* | (2006.01) |
| *H01S 5/024* | (2006.01) |
| *H01S 5/40* | (2006.01) |

(52) U.S. Cl.
CPC .......... *H01S 5/02469* (2013.01); *H01S 5/024* (2013.01); *H01S 5/02423* (2013.01); *H01S 5/4025* (2013.01)

(58) Field of Classification Search
CPC ............. H01S 5/02423; H01S 5/02469; H01S 5/4025; H01S 5/024
See application file for complete search history.

(56) References Cited

U.S. PATENT DOCUMENTS

| | | | | |
|---|---|---|---|---|
| 6,517,221 B1* | 2/2003 | Xie | ..................... | H01S 5/02469 |
| | | | | 257/714 |
| 2003/0142924 A1* | 7/2003 | Ikeda | .................... | H01S 5/4025 |
| | | | | 385/88 |
| 2013/0044776 A1* | 2/2013 | Schlie | .................... | H01S 3/042 |
| | | | | 372/34 |

* cited by examiner

*Primary Examiner* — Kinam Park
(74) *Attorney, Agent, or Firm* — James S. Tak

(57) ABSTRACT

A laser diode package includes a heat pipe having a fluid chamber enclosed in part by a heat exchange wall for containing a fluid. Wicking channels in the fluid chamber is adapted to wick a liquid phase of the fluid from a condensing section of the heat pipe to an evaporating section of the heat exchanger, and a laser diode is connected to the heat exchange wall at the evaporating section of the heat exchanger so that heat produced by the laser diode is removed isothermally from the evaporating section to the condensing section by a liquid-to-vapor phase change of the fluid.

10 Claims, 6 Drawing Sheets

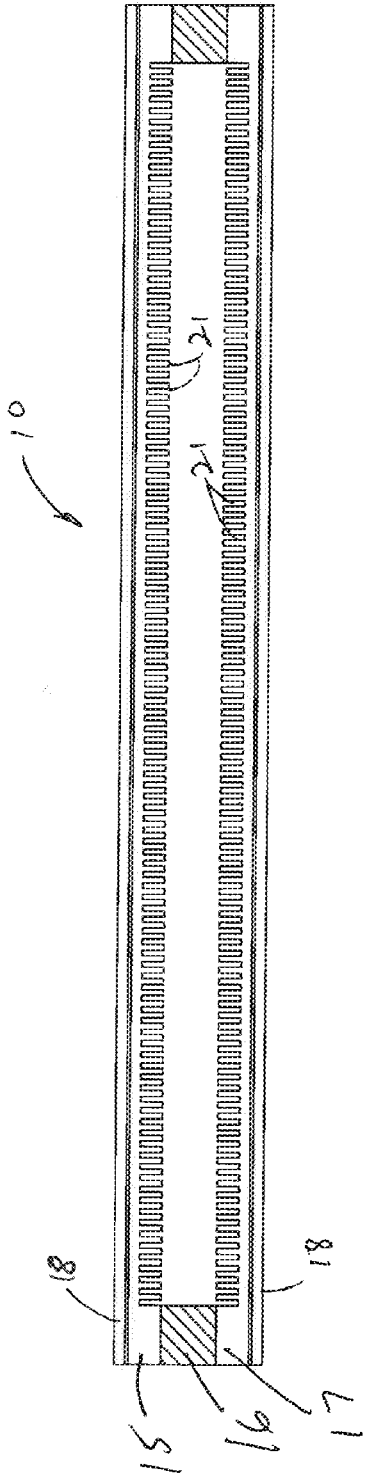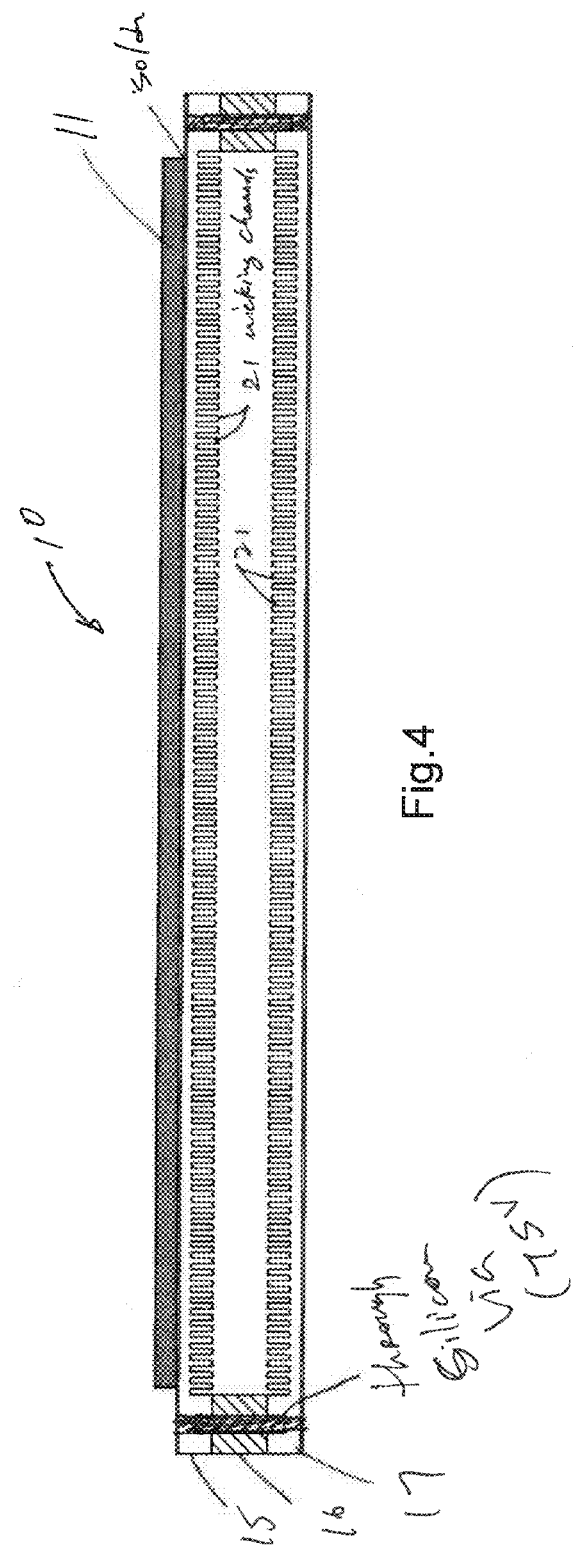

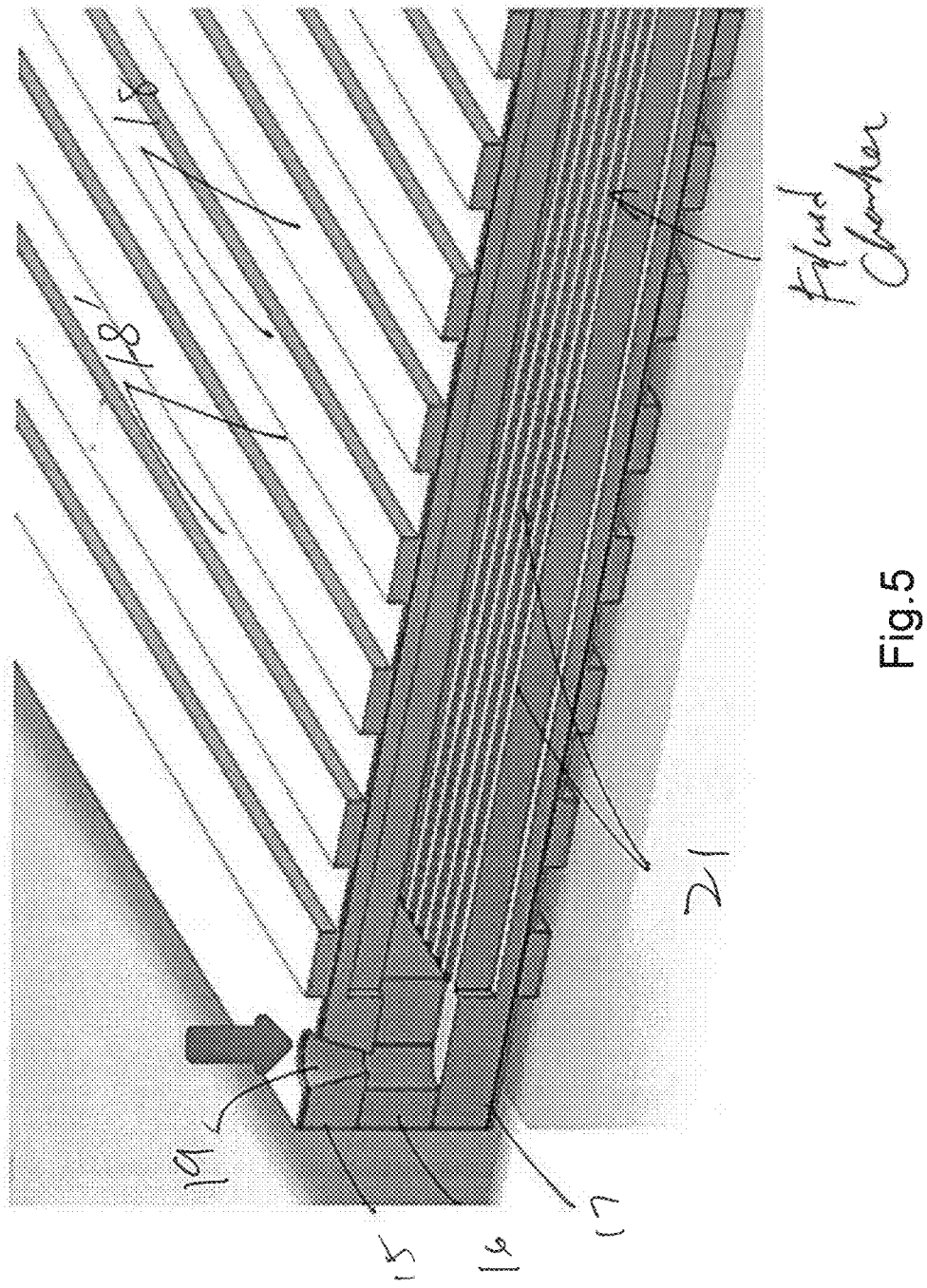

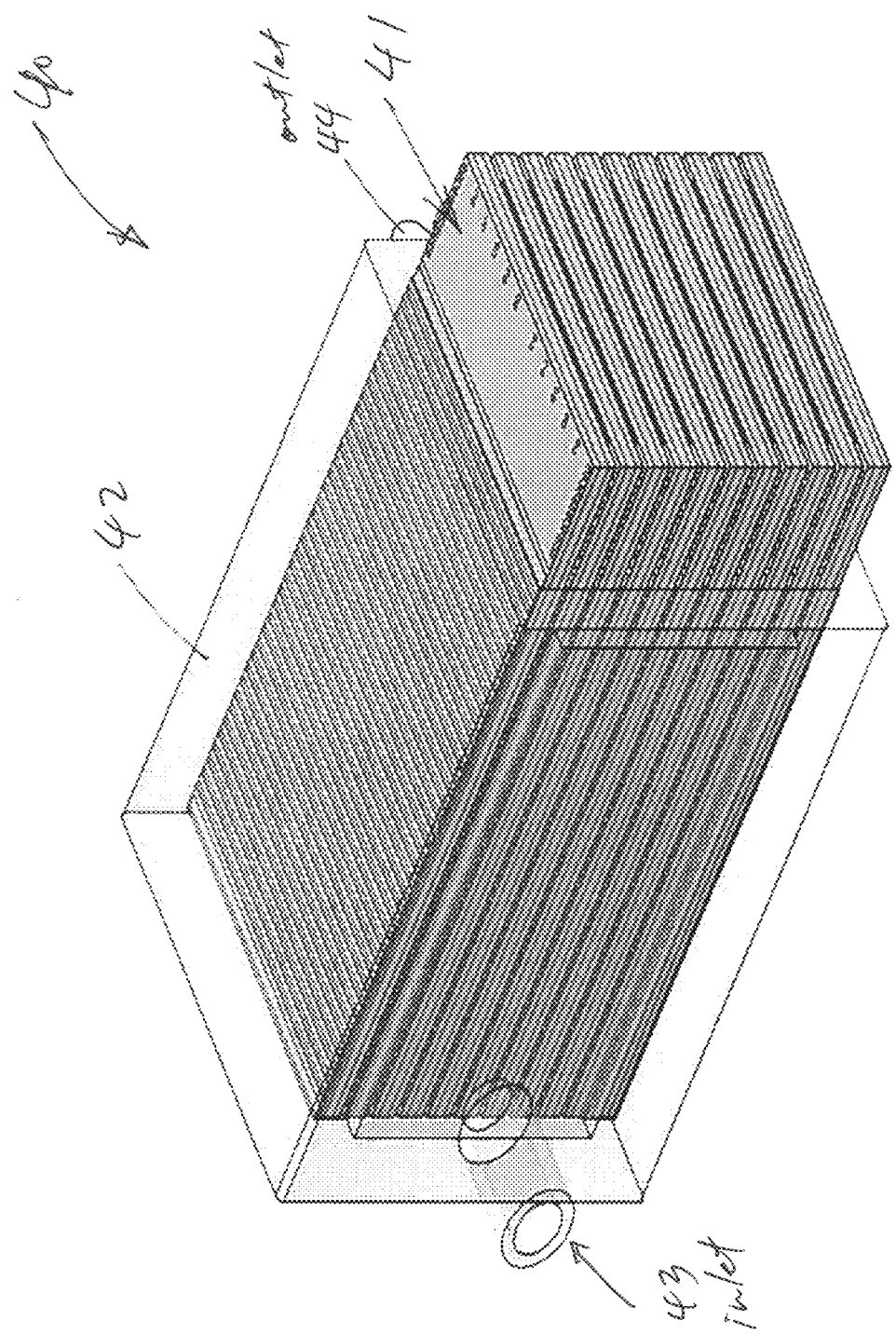

HIGH FLUX DIODE PACKAGING USING PASSIVE MICROSCALE LIQUID-VAPOR PHASE CHANGE

CROSS-REFERENCE TO RELATED APPLICATIONS

This application claims the benefit of U.S. provisional application No. 62/137,368 filed Mar. 24, 2015, which is incorporated by reference herein.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

The present invention generally relates to laser diode packages, and more particularly to a laser diode package using a passive microscale liquid-vapor phase change heat pipe.

High powered laser diodes for a variety of applications require very large heat flux removal (>400 W/cm2). To date, most solutions have relied upon microchannel cooling technology, but no solution has been verified at very large diode powers (e.g., >200 W/bar). Using an embedded heat pipe significantly reduces thermal resistance, and it may be possible to decrease the thickness of the heat pipe further to increase brightness. However, the multi-phase heat transfer and fluid flow characteristics at the scales required for effective heat removal is poorly understood.

Heat removal from laser diodes to the ultimate cooling fluid is the fundamental limitation for state-of-the-art laser diode systems. Heat generated at the surface of the diode must be transported through a variety of intervening thermal to the ultimate cooling fluid. This heat is conducted along extended surfaces, which impose thermal gradients onto the surface of the diode, thus limiting their lifetime and performance. In state-of-the-art systems, the team has observed that heat is conducted from more insulated diodes to neighborfsing diodes, which undesirably broadens the emitted wavelength spectrum. Furthermore, the sensible heat rejected to the cooling fluid also impacts the temperature uniformity of the system.

Increasing the power output per diode chip increases pump brightness, facilitating pump coupling to the laser gain medium, and decreases system cost on a per-Watt basis. Semiconductor light emitting diodes (LEDs) have similar technical issues as laser diodes, and solid state LED lighting is a targeted area for high-efficiency, general illumination laser diode products through the advancement of semiconductor technologies. High-brightness LEDs offer up to 66% savings in electric power consumption over conventional lighting and lead to a predicted $60B market in the next decade. However realizing these efficiencies requires highly efficient waste heat removal from the LED device and package.

SUMMARY

In one example embodiment, the present invention includes a laser diode package comprising: a heat pipe having a fluid chamber enclosed in part by a heat exchange wall for containing a fluid, and wicking channels in the fluid chamber [on an inner surface of the heat exchange wall and] adapted to wick a liquid phase of the fluid from a condensing section of the heat pipe to an evaporating section of the heat exchanger; and a laser diode connected to the heat exchange wall at the evaporating section of the heat exchanger so that heat produced by the laser diode is removed isothermally from the evaporating section to the condensing section by a liquid-to-vapor phase change of the fluid.

In another example embodiment, the present invention includes a stacked laser diode array package comprising: at least two laser diode package units (e.g. "repeating units"), each comprising: (1) a heat exchanger having a fluid chamber enclosed by a first planar heat exchange wall, a second planar heat exchange wall, and a spacer perimetrically connecting the first and second planar substrates together for containing a fluid, and wicking channels formed in the fluid chamber on inner surfaces of the first and second heat exchange walls and adapted to wick a liquid phase of the fluid from a condensing section of the heat exchanger to an evaporating section of the heat exchanger; and (2) a laser diode connected to the first planar heat exchange wall at the evaporating section of the heat exchanger so that heat produced by the laser diode is removed isothermally from the evaporating section to the condensing section by a liquid-to-vapor phase change of the fluid, wherein the laser diode package units are stacked together so that each laser diode, except for one of the two laser diodes of the two outer units of the stack, are also connected to the second planar heat exchange wall at an evaporating section of the heat exchanger of an adjacent laser diode package unit so that heat produced by the laser diode is also removed isothermally from the evaporating section to the condensing section of the adjacent laser diode package unit by a liquid-to-vapor phase change of the fluid.

In other embodiments, the present invention may additionally include one or more of the following: wherein the heat exchange wall has fins on an outer surface thereof for transferring heat to an external cooling fluid; wherein the fins are elongated structures arranged on the outer surface of the heat exchange wall to form cooling channels therebetween for channeling the external cooling fluid therethrough; wherein the heat exchange wall is a first planar substrate, and the fluid chamber is additionally enclosed in part by a second planar substrate and a spacer perimetrically connecting the first and second planar substrates together; wherein the second planar substrate is a second heat exchange wall with wicking channels formed in the fluid chamber on an inner surface of the second heat exchange wall and adapted to wick a liquid phase of the fluid from the condensing section of the heat exchanger to the evaporating section of the heat exchanger; further comprising an external fluid housing operably connected to provide an external cooling fluid across an outer surface of the heat exchange wall; wherein for each laser diode package unit the first and second planar heat exchange walls have fins on outer surfaces thereof for transferring heat to an external cooling fluid; wherein the fins are elongated structures arranged on the outer surfaces of the first and second heat exchange walls to form cooling channels therebetween for channeling the external cooling fluid therethrough; and further comprising an external fluid housing operably connected to provide an external cooling fluid across outer surfaces of the first and second planar heat exchange walls of each heat exchanger.

These and other implementations and various features and operations are described in greater detail in the drawings, the description and the claims.

Generally the present invention is directed to a compact laser diode package that utilizes an ultra-thin heat pipe to conduct heat away from the diode surface during continuous operation. In particular, the ultra-thin heat pipe removes heat isothermally through microscale liquid-vapor phase change, so as to remove very large heat fluxes (e.g. greater than 1 $kW/cm^2$) while maintaining a uniform diode temperature. It is designed to reject the heat to a constant temperature fluid which minimizes the imposed gradient both across a single diode and multiple diodes in a single package. This system can reject heat at a uniform temperature from the diode surface and significantly reduces the overall thermal resistance to the single phase cooling, thereby enabling >2× increase in laser diode power relative to the state-of-the-art.

And the compact laser diode package can be manufactured using silicon microfabrication techniques, which enable coefficient of thermal expansion matching for dissimilar materials through careful material selection and design.

The system generally operates as follows. Heat generated at the surface of the laser diode is rejected to a portion of a thin flat heat pipe, where a contained fluid is evaporated. This vapor is transported along the length of the heat pipe to a condensing section. The fluid is condensed into the pores of a wicking structure, where surface tension forces transport the fluid back to the evaporating section of the heat pipe. Heat is removed at the condensing portion of the heat pipe by an external fluid, usually water. The outside surface of the heat pipe may have small fins to decrease the overall thermal resistance.

One example implementation of the present system comprises a bank of series-connected diodes with a heat pipe placed in between each laser diode bar. Care is taken to ensure that the coefficient of thermal expansion of the heat pipe and the laser diode (typically gallium arsenide) match. This can be done through careful material selection (e.g., 1:3:1 copper-molybdenum-copper) or through the creation of a heterogeneous network of materials (e.g., silicon and copper) with an appropriate geometric design.

BRIEF DESCRIPTION OF THE DRAWINGS

The accompanying drawings, which are incorporated into and forma a part of the disclosure, are as follows:

FIG. 3 is a cross-sectional view of the embodiment of FIG. 2 taken along line B-B of the condenser section of the heat pipe.

FIG. 4 is a cross-sectional view of the embodiment of FIG. 2 taken along line A-A of the evaporation section of the heat pipe.

FIG. 5 is an enlarged cutaway perspective view of the embodiment of FIG. 2 taken along line C-C of the condenser section of the heat pipe.

FIG. 8 is a perspective view of an example embodiment of a laser diode stack of the present invention having a stack of 10 thin heat pipes for cooling nine laser diode dies, with the condenser section housed within a cooling fluid flow chamber.

DETAILED DESCRIPTION

Figure 1:
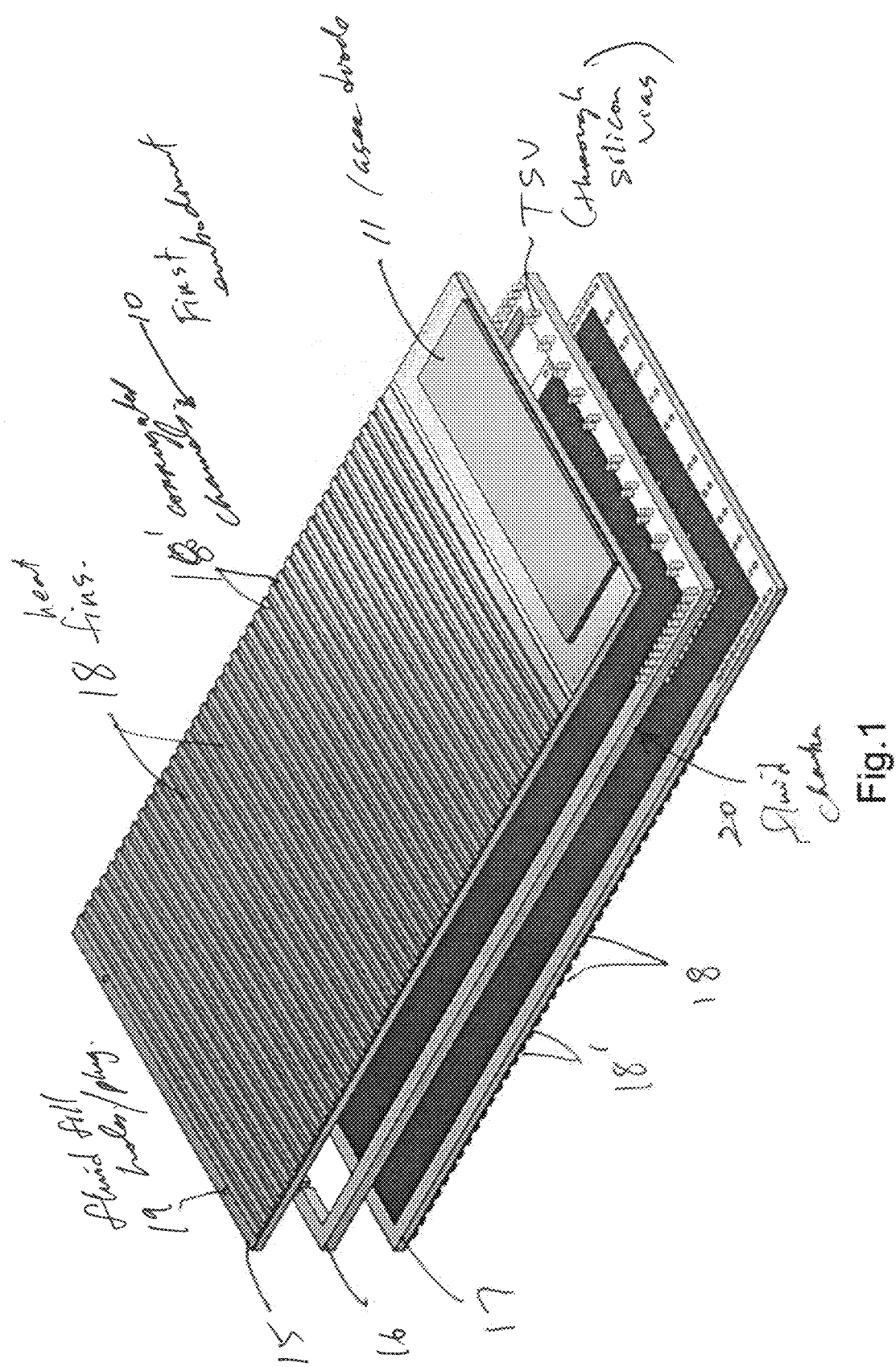
FIG. 1 is an exploded perspective view of a first example closed system embodiment of the laser diode package of the present invention.
Figure 2:
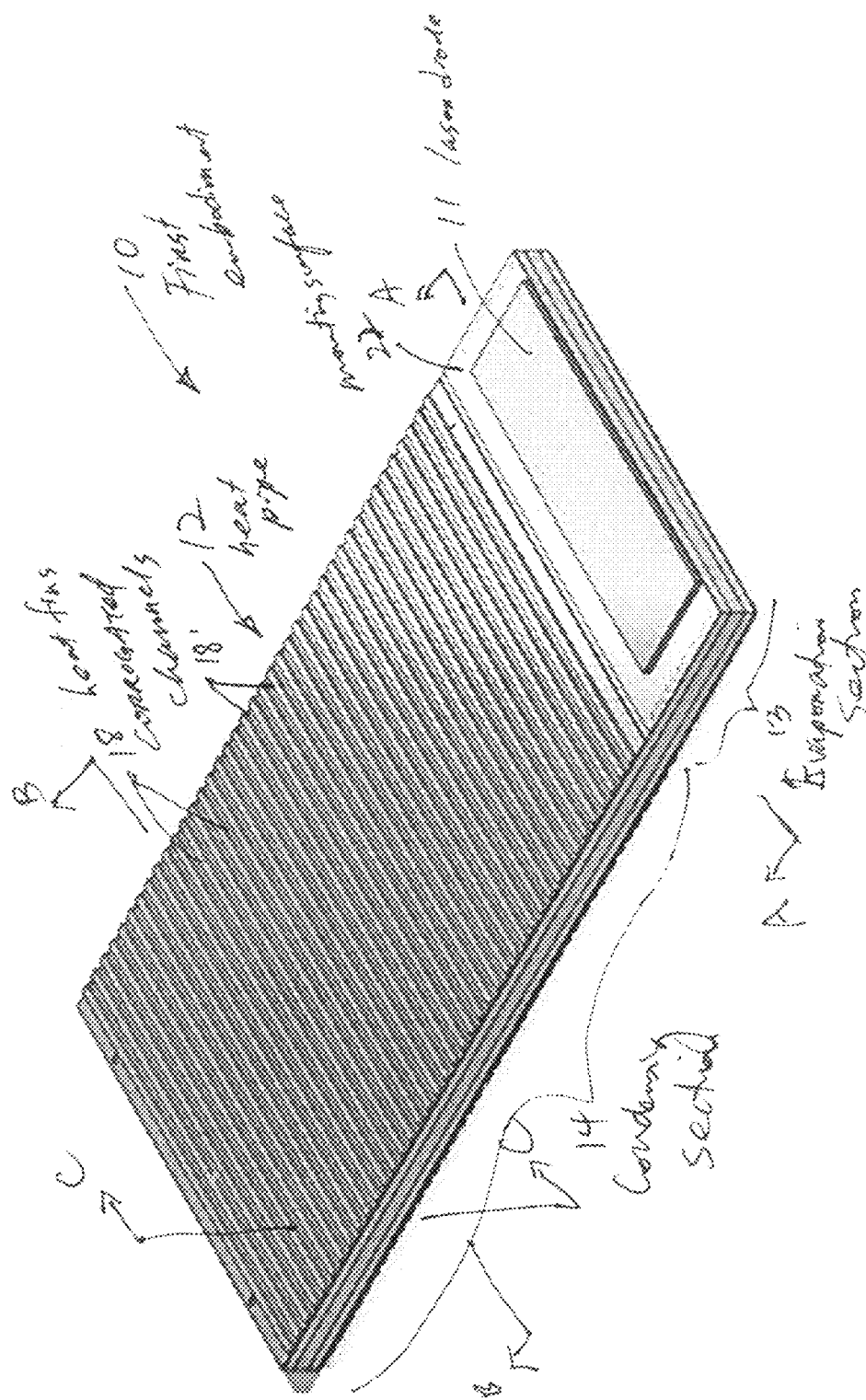
FIG. 2 is a perspective view of the first example closed system embodiment of the laser diode package of FIG. 1 when assembled.

Turning now to the drawings, FIG. 2 shows a first example embodiment of the laser diode packaging of the present invention, generally indicated at reference character 10, and having a fluid chamber 20 (see FIG. 1) containing a cooling fluid (not shown), such as water or a common refrigerant such as R134A, and a laser diode die 11 shown mounted on mounting surface 22, which is made from a conductive material, such as Cu. The laser diode packaging 10 is shown in FIG. 2 in exploded view to illustrate the fluid chamber 20 formed therein, and to show the manner of assembly which enables its flat profile. The fluid chamber 20 includes an evaporation section where the liquid-to-vapor phase change occurs, and between which water and vapor is transported through vapor phase change. The heat pipe 12 and the fluid chamber 20 have a flat profile with a condensing section 14 and an evaporation section 13 at opposite ends of the heat pipe 12. The evaporation section 13 has a laser diode 11 connected to a conductive mounting surface 21 of the heat pipe at the evaporation section. The laser diode 11 is connected to the heat exchange wall at the evaporating section of the heat exchanger so that heat produced by the laser diode is removed isothermally from the evaporating section to the condensing section by a liquid-to-vapor phase change of the fluid.

As can be best seen in FIG. 1, the heat pipe 12 may be constructed from 3 main parts: an upper substrate 15 a lower substrate 17 and a spacer 16 therebetween which together define the walls surrounding the fluid chamber. Each of the component parts may be constructed from, for example, Si, Cu, SiC, or diamond. A suitable sealant, especially a high temperature sealant adhesive, may be used to sealably connect the three pieces together. Because this is a closed system, heat exchange occurs through the walls. Therefore a "heat exchange wall is considered to be any part of the upper substrate, lower substrate, and spacer 16 that transfers heat therethrough and out from the fluid chamber. FIGS. 1 and 2 also show the exterior surface of the upper 15 and lower substrates 17 as having cooling fins 19 which form cooling channels 18' therebetween. The cooling fins 19 may be constructed from a thermally as well as electrically conductive material (e.g. Cu) for routing electrical power to the laser diodes. The cooling fins 19 may be formed as an orthogonal projection of a thermally conductive plating formed on the exterior surfaces of the substrates and other heat exchange walls of the laser diode packaging. The channels are arranged on the exterior surfaces of the heat pipe to transport cooling fluid in an orthogonal direction to FIG. 3 shows a cross-sectional view of the embodiment 10 of FIG. 2 taken along line B-B at the condenser section 14 of the heat pipe. And FIG. 4 shows another cross-sectional view of the embodiment 10 of FIG. 2 but taken along line A-A in the evaporation section 13. Wicking channels 21 are shown integrally formed on an inner surface of the heat exchange walls of the upper 15 and lower 16 substrates with a suitably tight pitch that enables capillary action therethrough from the condenser section back to the evaporation section. Example dimensions of the wicking channels 21 may include, for example, about 10-50 micron fin widths, about 10-50 micron wicking channel widths, and about 10-300 microns fin height.

FIG. 5 shows a cutaway perspective view of the embodiment of FIG. 2 taken along line B-B of the condenser section of the heat pipe, to show the wicking channels extending to a far end of the condensing section 14. Also a fluid fill hole 19 is shown provided by which cooling fluid may be provided into the fluid chamber, and which may be temporarily or permanently sealed after filling.

Figure 6:
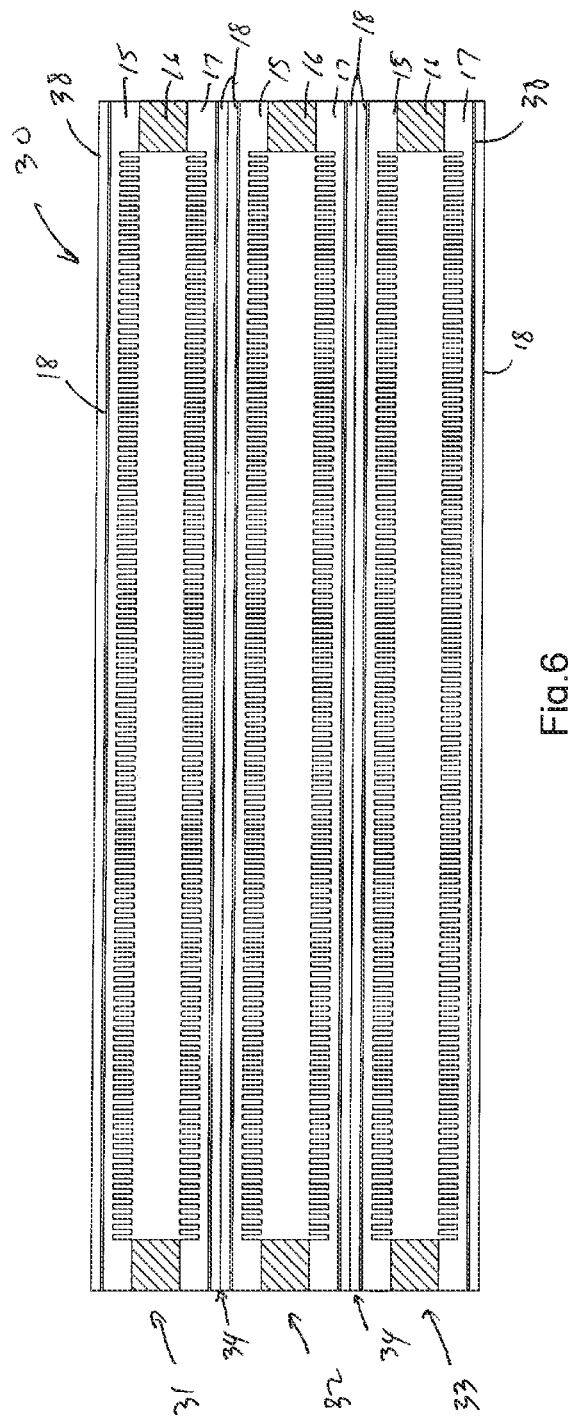
FIG. 6 is a cross-sectional view of another example embodiment of a laser diode stack having a stack of three heat pipes for cooling two laser diode dies, and taken along a condenser section.
Figure 7:
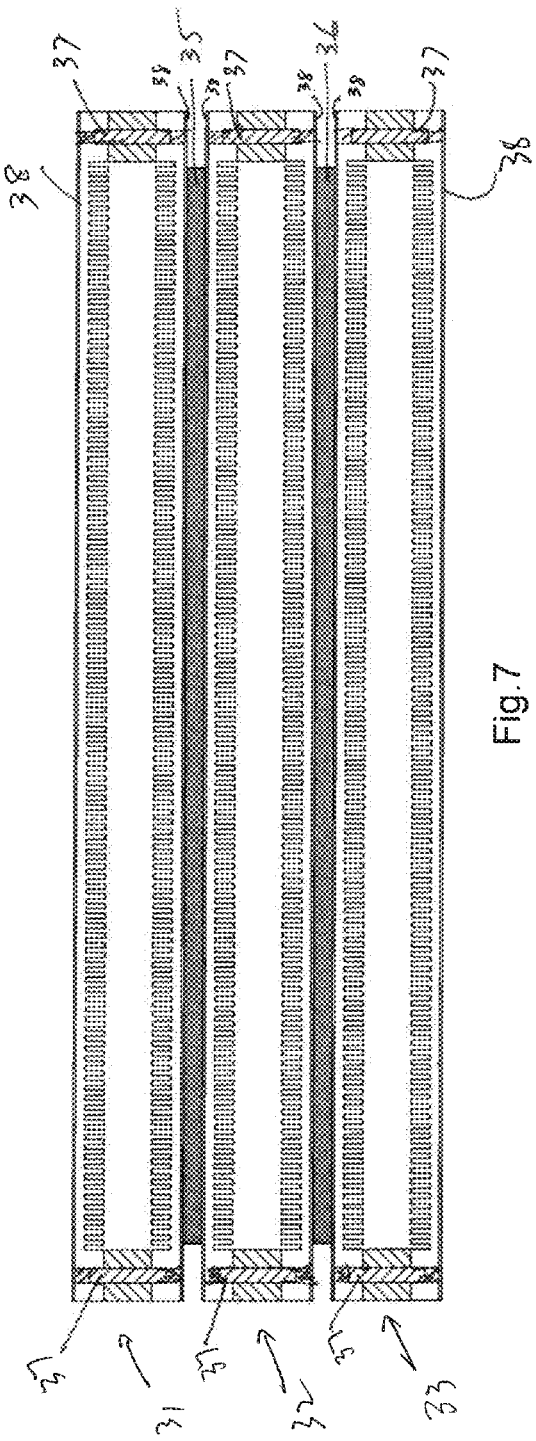
FIG. 7 is a cross-sectional view of the example embodiment of FIG. 6 taken along the evaporation section.

FIGS. 6 and 7 together show a cross-sectional view of another example embodiment of a laser diode stack having a stack of three heat pipes for cooling two laser diode dies. Similar to FIG. 3, FIG. 6 is taken along a condenser section of the heat pipe, and FIG. 7 is taken along an evaporation section of the heat pipe. As shown in FIG. 5, the cooling fins 18 are preferably suitably wide so that when arranged to contact and stack against corresponding cooling fins 18 of an adjacent heat pipe, as shown between heat pipes 31, 32, and 33 in FIG. 6, cooling conduits 34 are formed through which a cooling fluid may be flowed. And FIG. 7 shows two laser diodes 35 and 36, each being cooled from either side by a heat pipe. In particular, laser diode 35 is shown arranged to be cooled by heat pipes 31 and 32, and laser diode 36 is shown arranged to be cooled by heat pipes 32 and 33. Also shown in FIG. 7 are electrically conductive through vias (e.g. Cu vias) which electrically connect electrically conductive exterior plating 38 on opposite sides of the heat pipe. This allows electrical energy to be provided to laser diodes embedded in the stack.

And FIG. 8 shows a perspective view of an example embodiment of a laser diode stack 40 of the present invention having ten heat pipes for cooling nine laser diode dies. The condenser sections are shown housed within a cooling fluid flow housing 42 having an inlet 43 and an outlet 44 where a constant temperature fluid is flowed to minimize the imposed gradient both across a single diode and multiple diodes in a single package. The evaporation section housing the stacker laser diode dies are positioned outside the cooling fluid flow housing 42.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. A laser diode package comprising:
    a heat pipe having a fluid chamber enclosed in part by a heat exchange wall for containing a fluid, and wicking channels in the fluid chamber integrally formed on an inner surface of the heat exchange wall and adapted to wick a liquid phase of the fluid from a condensing section of the heat pipe to an adjacent evaporating section of the heat pipe; and
    a laser diode connected to the heat exchange wall at the evaporating section of the heat pipe so that heat produced by the laser diode is removed isothermally from the evaporating section to the condensing section by a liquid-to-vapor phase change of the fluid.

2. The laser diode package of claim 1,
    wherein the heat exchange wall has fins on an outer surface thereof for transferring heat to an external cooling fluid.

3. The laser diode package of claim 2,
    wherein the fins are elongated structures arranged on the outer surface of the heat exchange wall to form cooling channels therebetween for channeling the external cooling fluid therethrough.

4. The laser diode package of claim 1,
    wherein the heat exchange wall is a first planar substrate, and the fluid chamber is additionally enclosed in part by a second planar substrate and a spacer perimetrically connecting the first and second planar substrates together.

5. The laser diode package of claim 4,
    wherein the second planar substrate is a second heat exchange wall with wicking channels integrally formed in the fluid chamber on an inner surface of the second heat exchange wall and adapted to wick a liquid phase of the fluid from the condensing section of the heat exchanger to the evaporating section of the heat exchanger.

6. The laser diode package of claim 1,
    further comprising an external fluid housing operably connected to provide an external cooling fluid across an outer surface of the heat exchange wall.

7. A stacked laser diode array package comprising:
    at least two laser diode package units, each comprising:
    (1) a heat exchanger having a fluid chamber enclosed by a first planar heat exchange wall, a second planar heat exchange wall, and a spacer perimetrically connecting the first and second planar substrates together for containing a fluid, and wicking channels integrally formed in the fluid chamber on inner surfaces of the first and second heat exchange walls and adapted to wick a liquid phase of the fluid from a condensing section of the heat exchanger to an adjacent evaporating section of the heat exchanger; and (2) a laser diode connected to the first planar heat exchange wall at the evaporating section of the heat exchanger so that heat produced by the laser diode is removed isothermally from the evaporating section to the condensing section by a liquid-to-vapor phase change of the fluid, wherein the laser diode package units are stacked together so that each laser diode, except for one of the two laser diodes of the two outer units of the stack, are also connected to the second planar heat exchange wall at an evaporating section of the heat exchanger of an adjacent laser diode package unit so that heat produced by the laser diode is also removed isothermally from the evaporating section to the condensing section of the adjacent laser diode package unit by a liquid-to-vapor phase change of the fluid.

8. The stacked laser diode array package of claim 7,
wherein for each laser diode package unit the first and second planar heat exchange walls have fins on outer surfaces thereof for transferring heat to an external cooling fluid.

9. The stacked laser diode array package of claim 8,
wherein the fins are elongated structures arranged on the outer surfaces of the first and second heat exchange walls to form cooling channels therebetween for channeling the external cooling fluid therethrough.

10. The stacked laser diode array package of claim 7,
further comprising an external fluid housing operably connected to provide an external cooling fluid across outer surfaces of the first and second planar heat exchange walls of each heat exchanger.

\* \* \* \* \*